(12) United States Patent
Sugita et al.

(10) Patent No.: US 11,604,097 B2
(45) Date of Patent: Mar. 14, 2023

(54) CALIBRATION METHOD AND CALIBRATION SYSTEM

(71) Applicant: Tokyo Electron Limited, Tokyo (JP)

(72) Inventors: Kippei Sugita, Miyagi (JP); Hana Sasaki, Miyagi (JP); Kaoru Inaba, Miyagi (JP); Mitsuru Dohiwa, Miyagi (JP); Takashi Niinuma, Miyagi (JP); Hikaru Fujiwara, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 126 days.

(21) Appl. No.: 17/319,238

(22) Filed: May 13, 2021

(65) Prior Publication Data

US 2021/0356324 A1 Nov. 18, 2021

(30) Foreign Application Priority Data

May 14, 2020 (JP) .............................. JP2020-085347
Apr. 7, 2021 (JP) .............................. JP2021-065183

(51) Int. Cl.
*G01J 3/02* (2006.01)
*G01J 3/443* (2006.01)
*H01J 37/32* (2006.01)
*H05B 45/22* (2020.01)
*H05B 45/12* (2020.01)

(52) U.S. Cl.
CPC .......... *G01J 3/443* (2013.01); *H01J 37/32972* (2013.01); *H05B 45/12* (2020.01); *H05B 45/22* (2020.01)

(58) Field of Classification Search
CPC ...... G01J 3/44; G01J 3/02; G01J 3/443; G01J 2003/2873; G01J 2003/2879; G01J 3/28; G01J 3/0208; G01J 3/0218; H01J 37/32972; H01J 37/32091; H01J 37/244; H05B 45/12; H05B 45/22
See application file for complete search history.

(56) References Cited

U.S. PATENT DOCUMENTS 10,078,012 B2 * 9/2018 Furuta .................. G03G 15/043
2013/0109938 A1 * 5/2013 Kuhn .................. A61B 5/14551
600/328

FOREIGN PATENT DOCUMENTS

JP 2011-517097 A 5/2011
JP 2018-091836 A 6/2018
WO 2009/146136 A1 12/2009

* cited by examiner

*Primary Examiner* — Abdullahi Nur
(74) *Attorney, Agent, or Firm* — Pearne & Gordon LLP

(57) ABSTRACT

A calibration method includes placing an LED light source having a given wavelength range inside a reference apparatus; acquiring first data as an emission intensity of light at a wavelength, a light amount of the light being adjusted in stages by changing the light amount output from the LED light source; storing the first data in a memory; placing the LED light source in a calibration target apparatus; acquiring second data as an emission intensity of light at a wavelength, a light amount of the light being adjusted in the stages by changing the light amount output from the LED light source; and calculating a calibration formula based on the first data stored in the memory and the second data.

17 Claims, 12 Drawing Sheets

CALIBRATION METHOD AND CALIBRATION SYSTEM

CROSS-REFERENCE TO RELATED APPLICATION

This application claims the benefit of Japanese Patent Application Nos. 2020-085347 and 2021-065183 filed on May 14, 2020 and Apr. 7, 2021, respectively, the entire disclosures of which are incorporated herein by reference.

TECHNICAL FIELD

Patent Document 1 discloses a plasma processing apparatus for monitoring and controlling a process by connecting an emission spectroscopy device to a plasma processing chamber and analyzing a spectrum intensity of plasma emission formed inside the chamber. Patent Document 2 discloses a system for calibrating an emission spectroscopy device by installing an optical calibration device including a light source, such as a xenon flash lamp, having a continuous spectrum inside a chamber.

Patent Document 1: Published Japanese Translation of PCT Patent Application No. 2011-517097

Patent Document 2: Japanese Patent Laid-open Publication No. 2018-091836

SUMMARY

In one exemplary embodiment, a calibration method includes placing an LED light source having a given wavelength range inside a reference apparatus; acquiring first data as an emission intensity of light at a wavelength, a light amount of the light being adjusted in stages by changing the light amount output from the LED light source; storing the first data in a memory; placing the LED light source in a calibration target apparatus; acquiring second data as an emission intensity of light at a wavelength, a light amount of the light being adjusted in the stages by changing the light amount output from the LED light source; and calculating a calibration formula based on the first data stored in the memory and the second data.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

In the detailed description that follows, exemplary embodiments are described as illustrations only since various changes and modifications will become apparent to those skilled in the art from the following detailed description. The use of the same reference numbers in different figures indicates similar or identical items.

DETAILED DESCRIPTION

Figure 1:
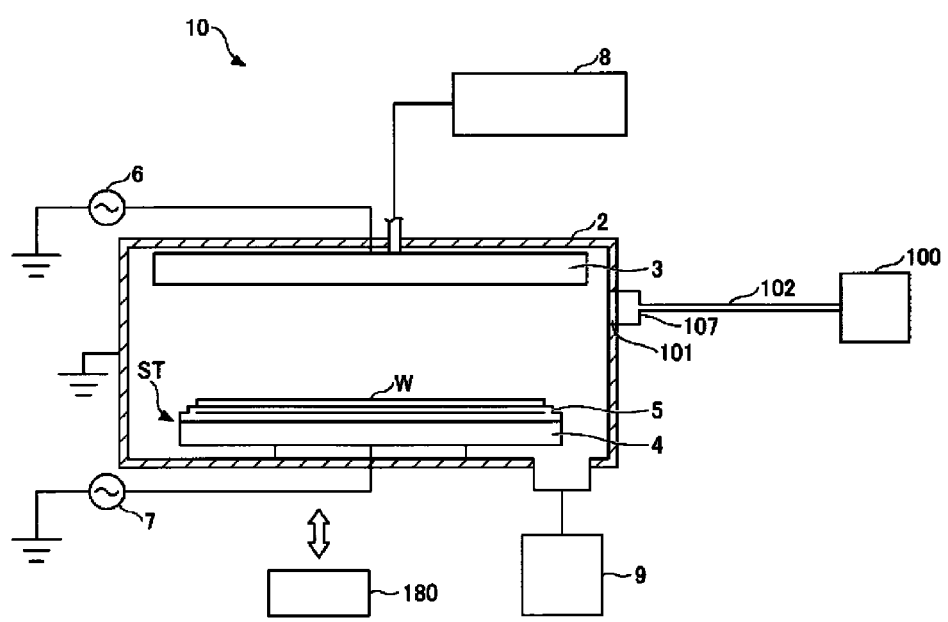
FIG. 1 is a schematic cross-sectional view of a plasma processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other exemplary embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of the present disclosure will be described with reference to the accompanying drawings. In the drawings, same or corresponding parts will be assigned same or corresponding reference numerals, and any redundant descriptions may be omitted.

[Plasma Processing Apparatus]

A plasma processing apparatus 10 according to an exemplary embodiment of the present disclosure will be described with reference to FIG. 1. FIG. 1 is a schematic cross-sectional view illustrating an example of the plasma processing apparatus 10 according to the exemplary embodiment.

The plasma processing apparatus 10 performs substrate processings, such as etching, film formation, and the like. The plasma processing apparatus 10 shown in FIG. 1 is a capacitively coupled plasma (CCP) processing apparatus in which plasma is formed between an upper electrode 3 and a stage ST inside a chamber 2. The stage ST includes a lower electrode 4 and an electrostatic chuck 5. During a process, a substrate W is held on the electrostatic chuck 5. A first high frequency power supply 6 is connected to the upper electrode 3, and a second high frequency power supply 7 is connected to the lower electrode 4. In another example, the first high frequency power supply 6 and the second high frequency power supply 7 may be connected to the lower electrode 4. The first high frequency power supply 6 is configured to output a first high frequency power, and the second high frequency power supply 7 is configured to output a second high frequency power. A frequency of the second high frequency power is lower than that of the first high frequency power. For example, the first high frequency power supply 6 may have a frequency of from 40 MHz to 100 MHz, and the second high frequency power may have a frequency of from 200 kHz to 40 MHz. A gas supply 8 is connected to the chamber 2 and configured to supply a processing gas into the chamber 2. Also, an exhaust device 9 is connected to the chamber 2 and configured to exhaust the inside of the chamber 2.

An observation window 101 is provided at a side wall of the chamber 2. The observation window 101 is made of, for example, quartz or the like, and is configured to transmit light and maintain a vacuum state inside the chamber 2. The observation window 101 is connected to an optical emission spectroscopy device 100 via a condensing component 107, such as a mirror or a lens, and an optical fiber 102. The optical emission spectroscopy device 100 is configured to detect an emission spectrum of plasma and determines a state of the plasma from the emission spectrum to monitor and control a process performed inside the plasma processing apparatus 10. EPD (End Point Detection) is an example of OES (Optical Emission Spectroscopy) conducted by the optical emission spectroscopy device 100. Accordingly, processes of an etching processing and a cleaning processing are monitored by monitoring the state of the plasma.

The plasma processing apparatus 10 further includes a controller 180. The controller 180 may be a computer including, for example, a processor, a storage such as a memory, an input device, a display device, a signal input/output interface. The controller 180 controls each component of the plasma processing apparatus 10. The controller 180 may allow an operator to perform an operation of inputting a command to manage the plasma processing apparatus 10 by using the input device. Also, the controller 180 may visibly display an operational situation of the plasma processing apparatus 10 through the display device. Further, the storage of the controller 180 stores a control program and recipe data. The control program is executed by the processor of the controller 180 to perform various processings by using the plasma processing apparatus 10. The processor of the controller 180 executes the control program and controls each component of the plasma processing apparatus 10 depending on the recipe data.

The optical emission spectroscopy device 100 is calibrated by itself (the optical emission spectroscopy device 100) with respect to certain references before shipped from a spectrometer sensor maker. However, optical emission of the plasma is monitored by the optical emission spectroscopy device 100 connected via installation components, for example, the observation window 101, the condensing component 107, such as a mirror or a lens, and the optical fiber 102. Therefore, even if the optical emission spectroscopy device 100 is calibrated by itself with respect to the certain references, when the optical emission spectroscopy device 100 is connected to the chamber 2, a detection result of the optical emission spectroscopy device 100 may differ for each chamber due to the influence of the installation components or the like. Accordingly, deviations may be accumulated in log data of monitoring records of the optical emission spectroscopy, which may influence data interpretation so that the productivity is decreased.

Therefore, in a calibration method according to the present exemplary embodiment, an LED jig 20 equipped with an LED (light emitting diode) light source 21 which serves as a reference for calibration as will be described later is provided inside a reference device (see FIG. 3) and light is radiated to the optical emission spectroscopy device 100 connected to the chamber 2.

The radiated reference light is broad light, and an output of LED light can be adjusted by a CPU 104 of the optical emission spectroscopy device 100 to be described later. The radiated light is projected to the optical emission spectroscopy device 100 via various installation components, such as a structure inside the chamber 2, the observation window 101, the condensing component 107 and the optical fiber 102. Since the radiated reference light is calibrated to be constant, differences from data to be originally obtained are influenced by the installation components inside the chamber 2. Therefore, these differences are calibrated for each chamber, and, thus, it is possible to reduce an error in the optical emission spectroscopy using the optical emission spectroscopy device 100.

[Outline of Calibration]

Figure 2:
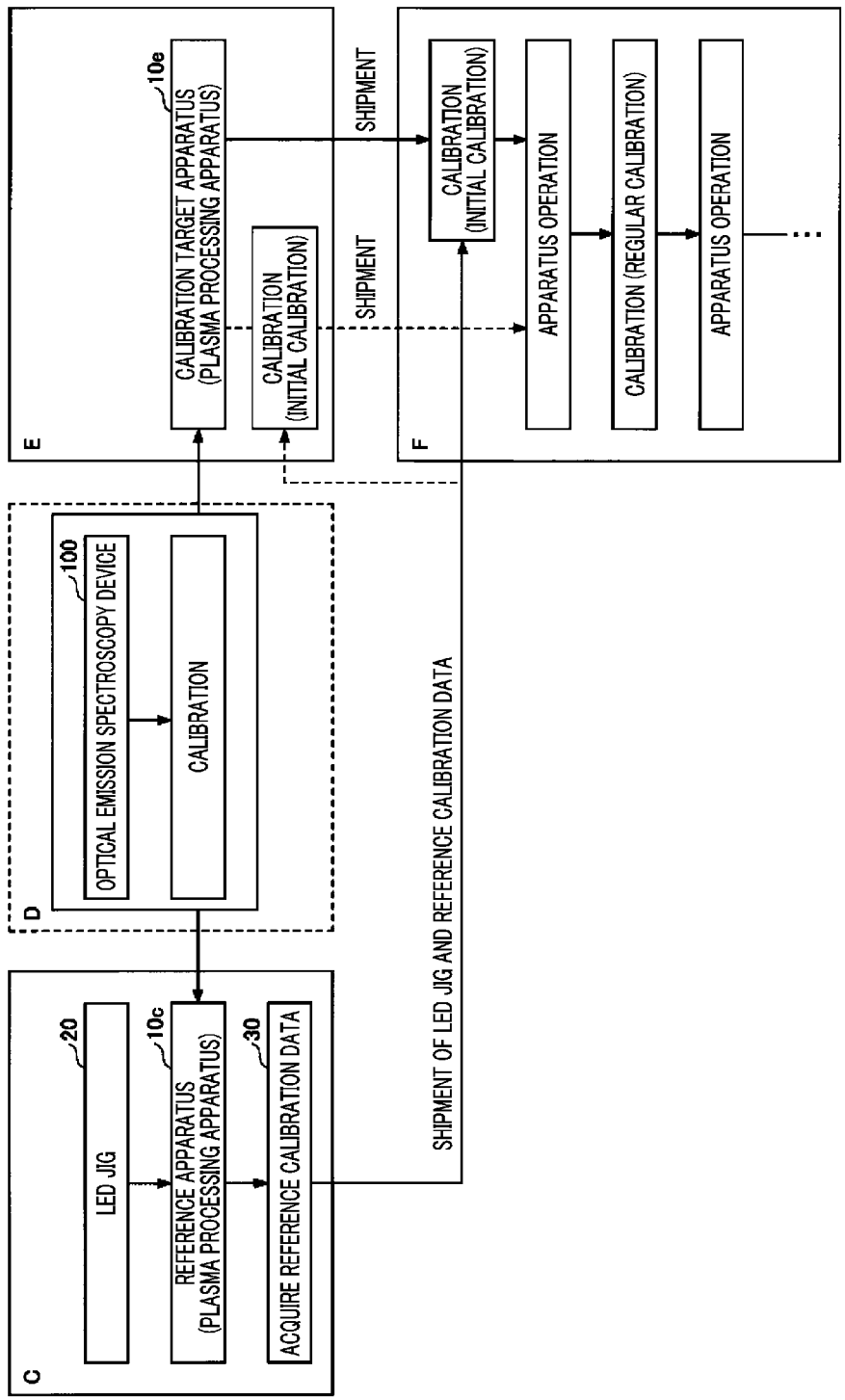
FIG. 2 shows a diagram illustrating a calibration operation according to the exemplary embodiment.

In a factory C of a semiconductor manufacturing apparatus maker shown in FIG. 2, a plasma processing apparatus 10c serving as a reference (hereinafter, referred to as "reference apparatus 10c") is placed. The LED jig 20 is provided inside a chamber of the reference apparatus 10c equipped with the optical emission spectroscopy device 100 calibrated in a factory D of the spectrometer sensor maker, and reference calibration data are acquired.

In a factory E of the semiconductor manufacturing apparatus maker (factory E may be the same as factory C), a plasma processing apparatus 10e (hereinafter, referred to as "calibration target apparatus 10e") serving as a calibration target to be shipped to a factory F of a semiconductor maker is placed. The calibration target apparatus 10e is equipped with the optical emission spectroscopy device 100 calibrated in the factory D of the spectrometer sensor maker. After the calibration target apparatus 10e is shipped to the factory F, the LED jig 20 is provided inside a chamber of the calibration target apparatus 10e and calibration (initial calibration) is performed ((1) in FIG. 2). When the calibration (initial calibration) is performed, a calibration formula is calculated with reference to the reference calibration data. The calibration (initial calibration) may be performed onto the calibration target apparatus 10e during a process in the factory E before being shipped to the factory F ((2) in FIG. 2).

It is desirable that the calibration is performed regularly while the calibration target apparatus 10e is operated. The regular calibration may be performed in the factory F during maintenance of the calibration target apparatus 10e. Since a reaction product adheres to the observation window 101 during a substrate processing, the observation window 101 is gradually blurred. Therefore, it is desirable that the calibration is performed after the reaction product is removed by the cleaning during the maintenance of the plasma processing apparatus 10.

Figure 3:
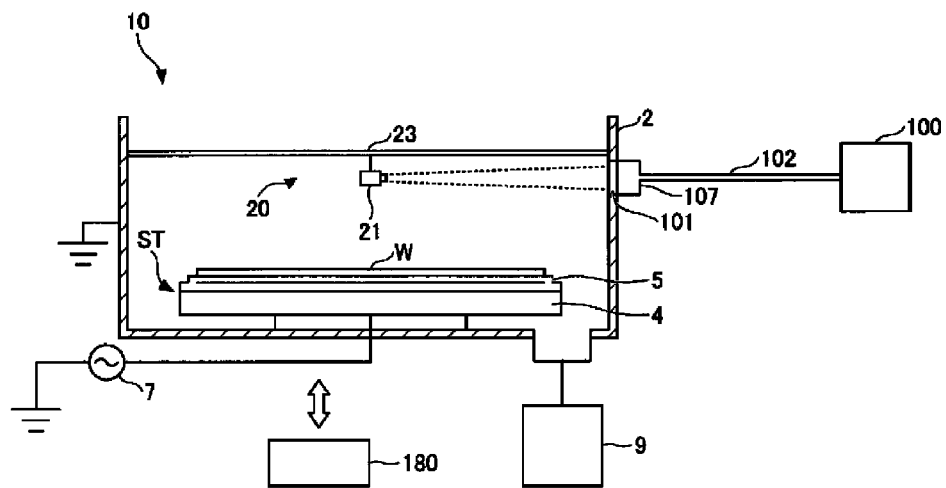
FIG. 3 illustrates that the plasma processing apparatus of FIG. 1 is equipped with an LED jig.

FIG. 3 is a schematic cross-sectional view illustrating the LED jig 20 provided inside a chamber of the plasma processing apparatus 10 of FIG. 1. The plasma processing apparatus 10 represents the reference apparatus 10c and the calibration target apparatus 10e. As shown in FIG. 3, the LED jig 20 includes the LED light source 21 and a support 23 configured to support the LED light source 21. The support 23 extends from a wall surface of the chamber 2 to be provided inside the chamber 2. Thus, the LED light source 21 is located toward the observation window 101 at a position substantially same plane to the observation window 101. An upper lid of the chamber 2 is opened and then, the LED jig 20 is placed. The LED jig 20 may include a communication unit and a controller. The LED jig 20 provided inside the chamber of the reference apparatus 10c is the same as the LED jig 20 provided inside the chamber of the calibration target apparatus 10e.

[Operation Between Plasma Processing Apparatus and Optical Emission Spectroscopy Device]

Figure 4:
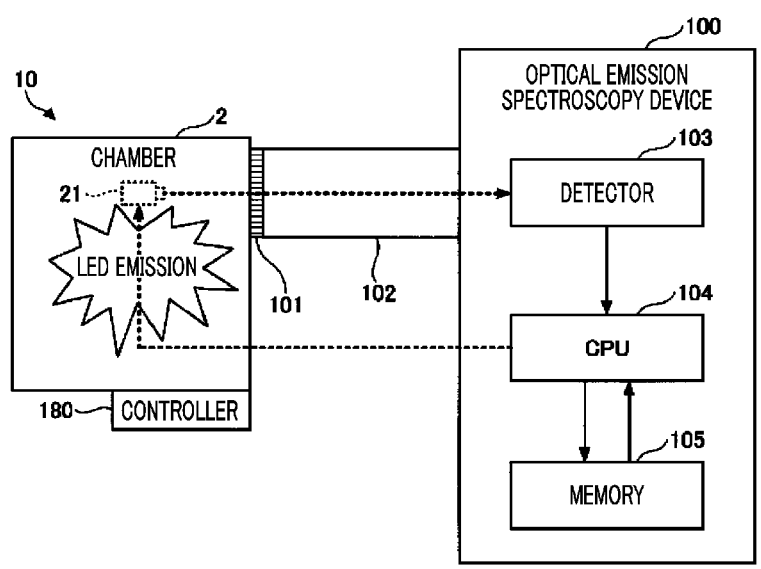
FIG. 4 is a diagram provided to explain an operation between the plasma processing apparatus and an emission spectroscopy device according to the exemplary embodiment.

Hereinafter, an operation between the plasma processing apparatus 10 (the reference apparatus 10c, the calibration target apparatus 10e) and the optical emission spectroscopy device 100 will be described in brief. FIG. 4 is a diagram provided to explain an operation between the plasma processing apparatus 10 and the optical emission spectroscopy device 100 according to the exemplary embodiment.

The optical emission spectroscopy device 100 includes a detector 103, the CPU 104 and a memory 105. The memory 105 stores therein a given program for analyzing the emission intensity of plasma and the emission intensity of the LED light detected by the optical emission spectroscopy device 100.

The CPU 104 switches an operation between a calibration mode and a detection mode. In the calibration mode, the CPU 104 executes a given calibration program stored in the memory 105 to control the LED light source 21 to turn on/off. The CPU 104 controls the detector 103 to detect the light output from the LED light source 21 inside the plasma processing apparatus 10 serving as the reference apparatus 10c or the calibration target apparatus 10e. The detector 103 is configured to detect the emission intensity of the LED light which is output from the LED light source 21 provided in the LED jig 20 and whose light amount is adjusted in stages. Data detected in the reference apparatus 10c are referred to as "first data", and the first data are stored as reference calibration data in the memory 105. The reference calibration data may be reference information for calibration. Data detected in the calibration target apparatus 10e are referred to as "second data".

Figure 5A:
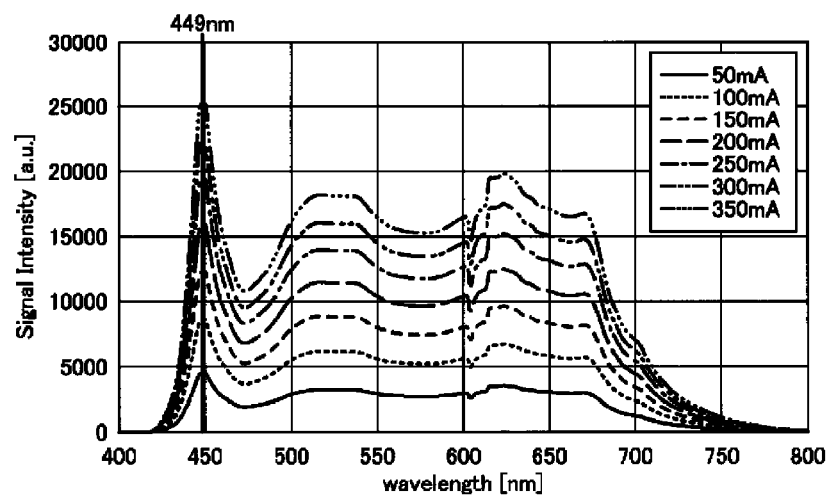
FIG. 5A and FIG. 5B show examples of reference calibration data according to the exemplary embodiment.

FIG. 5A shows a detection result of detecting the light output from the LED light source 21 by the optical emission spectroscopy device 100 while the CPU 104 controls a current value to be supplied to the LED light source 21 in the range of from 50 mA to 350 mA at an interval of 50 mA. In FIG. 5A, the horizontal axis represents a wavelength of the light and the vertical axis represents an emission intensity of the LED light of each wavelength at each current value detected by the optical emission spectroscopy device 100. According to this result, as the current value increases, the emission intensity of the LED light output from the LED light source 21 increases. That is, the CPU 104 controls the current value to be supplied to the LED light source 21, so that the LED light source 21 can output the LED light whose light amount is adjusted in stages.

Figure 5B:
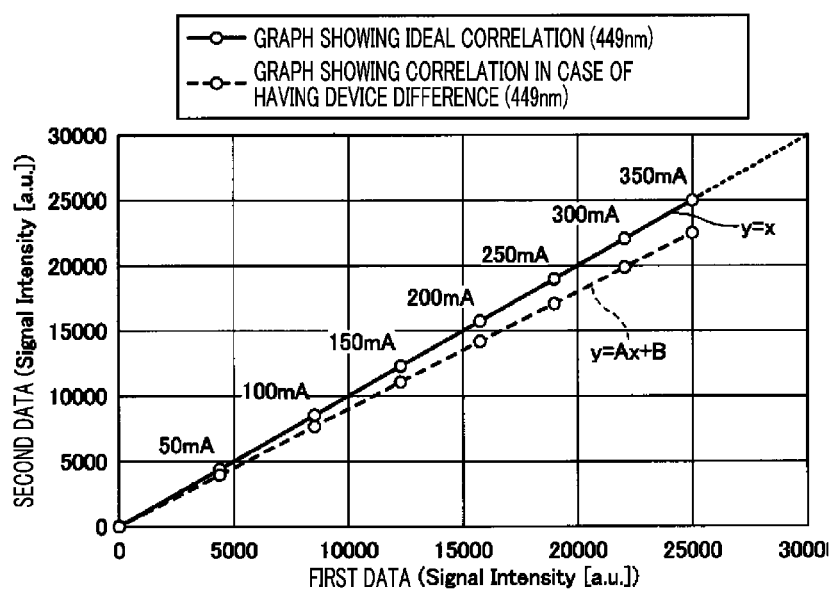

FIG. 5B shows an example of the emission intensity of the LED light detected by the optical emission spectroscopy device 100 when the LED light source 21 is controlled at a wavelength of 449 nm shown in FIG. 5A at each current value of 50 mA, 100 mA, 150 mA, 200 mA, 250 mA, 300 mA and 350 mA. In FIG. 5B, the horizontal axis represents the first data and the vertical axis represents the second data. That is, FIG. 5B is a graph showing a correlation between the first data and the second data. Also, the first data and the second data are not limited to this wavelength, and just need to be the emission intensity of the LED light which has a specific wavelength in the range of from 200 nm to 870 nm and whose light amount is adjusted in stages.

Referring to FIG. 5B, if the second data detected from the optical emission spectroscopy device 100 connected to the calibration target apparatus 10e are identical to the first data which are the reference calibration data, the correlation is represented by y=x. However, actually, between the second data and the first data, there is a difference caused by an error for each chamber due to the influence of the installation components. For this reason, an approximate expression showing the correlation between the first data and the second data is represented by y=Ax+B.

[Calibration Method (Acquisition of Reference Calibration Data)]

Figure 6:
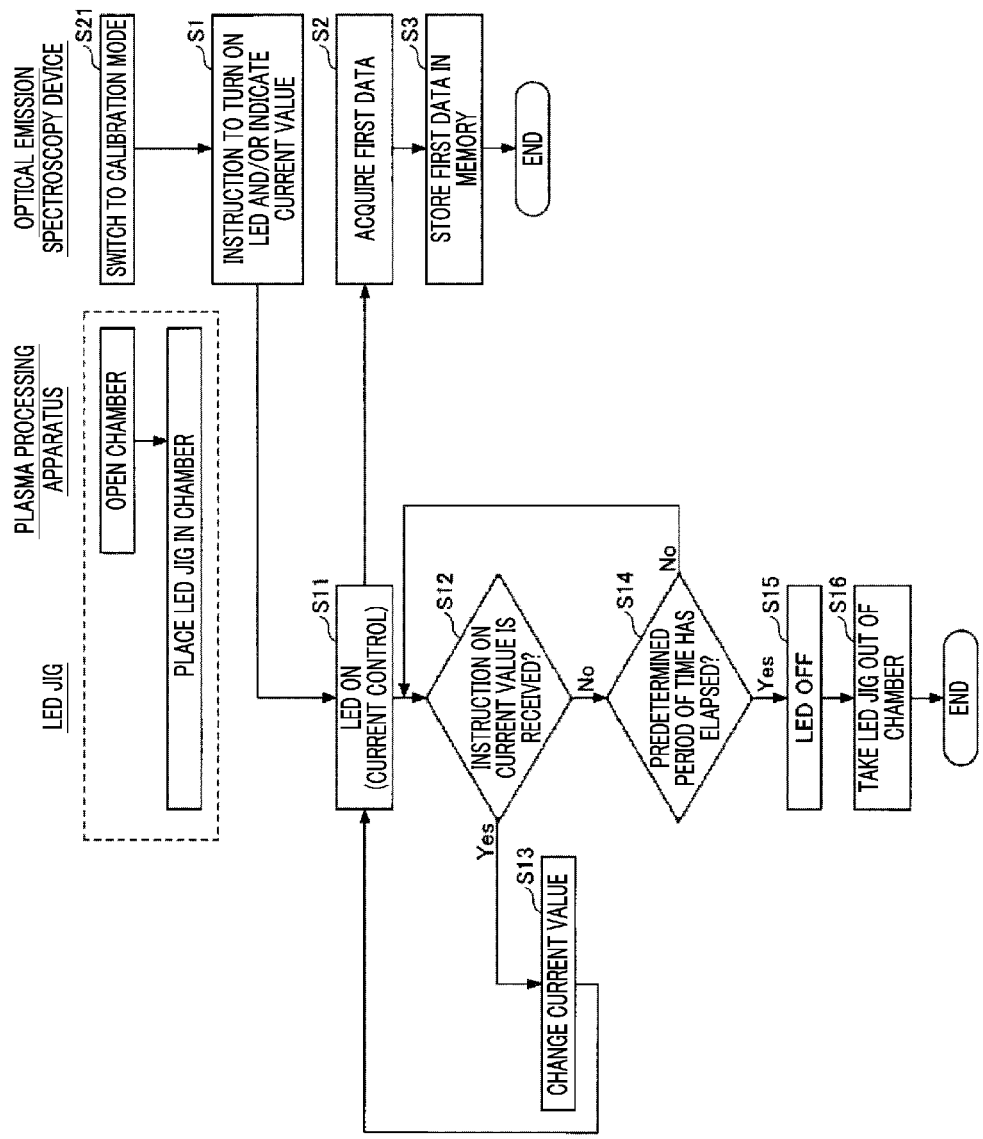
FIG. 6 is a flowchart showing a calibration method (acquisition of reference calibration data) according to the exemplary embodiment.

Hereinafter, acquisition of the reference calibration data in the calibration method according to the exemplary embodiment will be described with reference to FIG. 6. FIG. 6 is a flowchart showing the calibration method (acquisition of the reference calibration data) according to the exemplary embodiment. Before the present processing is started, the chamber 2 of the reference apparatus 10c is opened, the LED jig 20 is provided in the chamber 2 and the LED light source 21 for reference is placed inside the chamber 2 so as to project the light to the observation window 101 as indicated by a dotted frame in FIG. 6.

When the present processing is started, the CPU 104 of the optical emission spectroscopy device 100 provided in the reference apparatus 10c switches the detection mode to the calibration mode (process S21). Then, the CPU 104 transmits an instruction signal to turn on the LED and transmits a control signal to indicate the current value (process S1). The CPU 104 may transmit only the instruction signal to turn on the LED or only the control signal to indicate the current value.

In this regard, the communication unit of the LED jig 20 receives the instruction signal to turn on the LED and the control signal to indicate the current value. The controller of the LED jig 20 turns on the LED light source 21 in response to the received instruction signal (process S11).

Then, the controller determines whether or not the control signal to indicate the current value has been received (process S12). The controller determines "YES" when it is determined that the control signal to indicate the current value has been received, and controls (changes) the current value to be supplied to the LED light source 21 based on the control signal to indicate the current value (process S13). Thus, the LED light of the light amount corresponding to the current value supplied to the LED light source 21 is output. The detector 103 of the optical emission spectroscopy device 100 detects the emission intensity of the output LED light, and the CPU 104 acquires the detected emission intensity, i.e., first data (reference calibration data) (process S2).

In the process S12, when it is determined that the control signal to indicate the current value has not been received, the controller of the LED jig 20 determines whether or not a predetermined time period has elapsed (process S14) and waits until the predetermined time period has elapsed. If the control signal is received before the predetermined time period elapses, the processing proceeds to the process S13. Then, the controller changes the current value to be supplied to the LED light source 21 based on the control signal. In the process S14, if the predetermined time period has elapsed before the control signal is received, the controller turns off the LED light source 21 (process S15). Thus, the LED jig 20 is taken out of the chamber 2 (process S16), and the present processing is ended.

Meanwhile, in the process S1, in the optical emission spectroscopy device 100, whenever the control signal to indicate the current value is transmitted from the CPU 104, the LED light source 21 outputs the LED light whose light amount is adjusted in stages based on the current values changed through the processes S11 to S13. The detector 103 detects the emission intensity of the LED light whose light amount is adjusted in stages, acquires the first data (reference calibration data) (process S2) and stores the first data in the memory 105 (process S3). Then, the present processing is ended.

The present processing is performed at each wavelength, and, thus, the first data can be acquired at each wavelength in the range of from 200 nm to 870 nm.

[Calibration Method (Calculation of Calibration Formula)]

Figure 7:
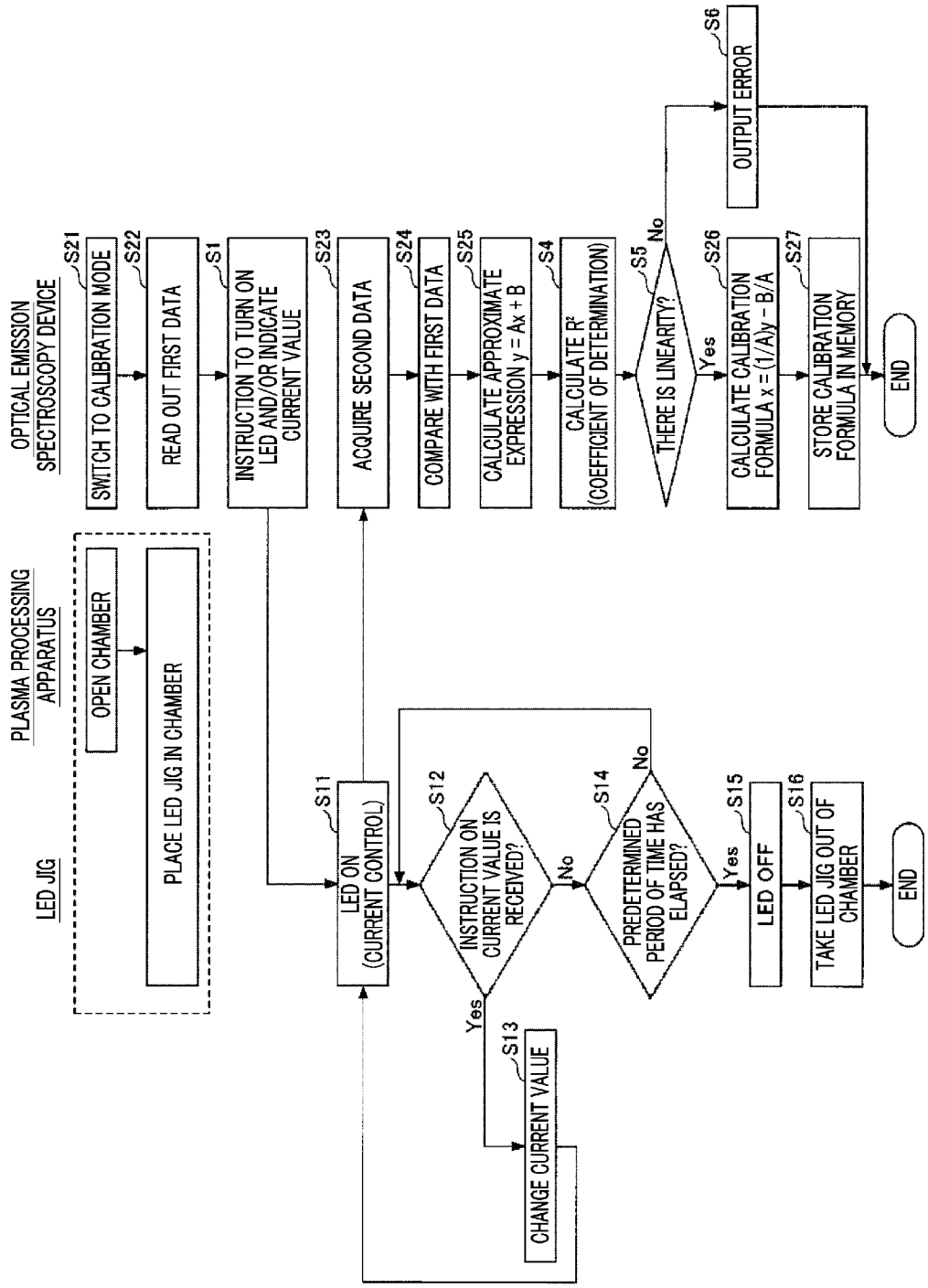
FIG. 7 is a flowchart showing a calibration method (calculation of a calibration formula) according to the exemplary embodiment.

Hereinafter, calculation of a calibration formula in the calibration method according to the exemplary embodiment will be described with reference to FIG. 7. FIG. 7 is a flowchart showing the calibration method (calculation of the calibration formula) according to the exemplary embodiment.

Before the present processing is started, the chamber 2 of the calibration target apparatus 10e is opened, the LED jig 20 is provided in the chamber 2 and the LED light source 21 for reference is placed inside the chamber 2 as indicated by a dotted frame in FIG. 7. Hereinafter, the same processes as those shown in FIG. 6 are denoted by the same process numbers, and descriptions of the same processes denoted by the same process numbers will be omitted.

When the present processing is started, the CPU 104 of the optical emission spectroscopy device 100 provided in the calibration target apparatus 10e switches the detection mode to the calibration mode (process S21). Further, the CPU 104 reads out the first data stored in the memory 105 of the optical emission spectroscopy device 100 connected to the reference apparatus 10c (process S22).

Then, the CPU 104 transmits the instruction signal to turn on the LED and transmits the control signal to indicate the current value (process S1). The LED jig 20 performs the processes S11 to S16. In this regard, the detector 103 of the optical emission spectroscopy device 100 detects the emission intensity of the LED light which is output from the LED light source 21 and whose light amount is adjusted in stages and acquires the second data (process S23). Thereafter, the second data are compared with the first data (process S24) and an approximate expression y=Ax+B is calculated by using the first data and the second data (process S25).

Then, the CPU 104 calculates a coefficient of determination $R^2$ (process S4). If the coefficient of determination $R^2$ is equal to or higher than a given threshold value, it may be determined that the approximate expression showing the correlation between the first data and the second data (see FIG. 5B) has linearity.

Then, in the process S5, if it is determined that the approximate expression showing the correlation between the first data and the second data has linearity, the CPU 104 calculates a calibration formula x=(1/A)y−B/A from the approximate expression y=Ax+B (process S26). The CPU 104 stores the calibration formula x=(1/A)y−B/A in the memory 105 (process S27), and the present processing is ended.

In the process S5, if it is determined that the approximate expression showing the correlation between the first data and the second data does not have linearity, the CPU 104 outputs an error (process S6), and the present processing is ended.

[Calibration Method (Calibration of Detection Value)]

Figure 8:
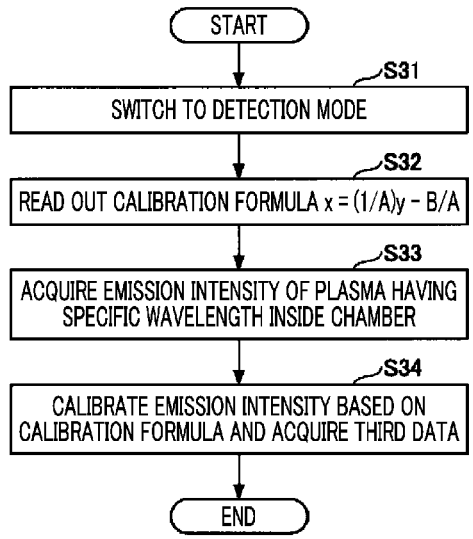
FIG. 8 is a flowchart showing a calibration method (calibration of a detection value) according to the exemplary embodiment.
Figure 9:
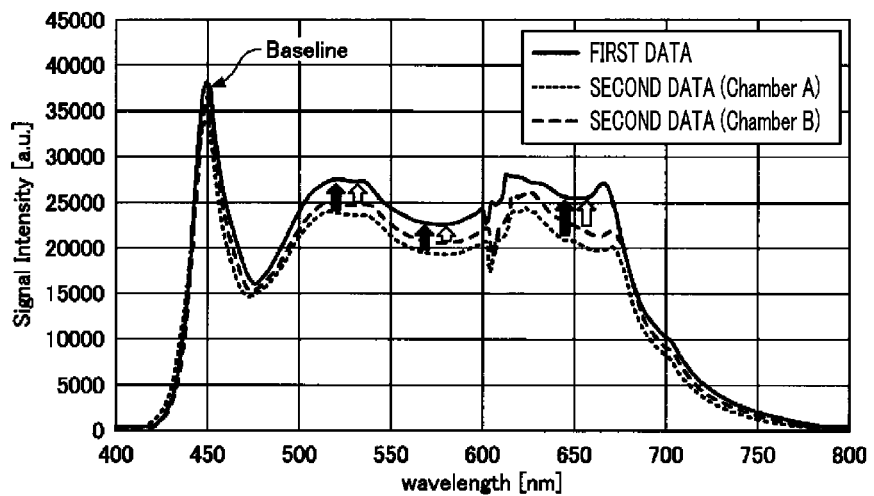
FIG. 9 shows an example of a calibration result according to the exemplary embodiment.

Hereinafter, calibration of a detection value by the optical emission spectroscopy device 100 in the calibration method according to the exemplary embodiment will be described with reference to FIG. 8 and FIG. 9. FIG. 8 is a flowchart showing the calibration method (calibration of the detection value) according to the exemplary embodiment. FIG. 9 shows an example of a calibration result according to the exemplary embodiment.

When the present processing is started, the CPU 104 of the optical emission spectroscopy device 100 provided in the calibration target apparatus 10e switches the calibration mode to the detection mode (process S31). Then, the CPU 104 reads out the calibration formula x=(1/A)y−B/A stored in the memory 105 (process S32). Thereafter, the detector 103 detects the emission intensity of a specific wavelength of the plasma formed inside the chamber 2 of the calibration target apparatus 10e, and the CPU 104 acquires the detected emission intensity (process S33). Then, the CPU 104 calibrates the acquired emission intensity based on the calibration formula x=(1/A)y−B/A for a specific wavelength equal to the wavelength of the detected emission intensity (process S34) and acquires third data, and then, the present processing is ended.

Accordingly, the emission intensity, which is the detection value of the optical emission spectroscopy device 100, in the approximate expression shown in FIG. 5B can be calibrated to the emission intensity in the equation y=x shown in FIG. 5B by using the calibration formula x=(1/A)y−B/A. Accordingly, a deviation between the detection values of the optical emission spectroscopy device 100 caused by the influence of the installation components in each chamber can be removed.

Although each of the acquisition of the reference calibration data, the calculation of the calibration formula and the calibration of the detection value has been described as being controlled by the CPU 104, the present disclosure is not limited thereto. The controller 180 of the plasma processing apparatus 10 may control each of the operations in the calibration method.

Although the CPU 104 has been described as transmitting the instruction signal to turn on the LED and the control signal to indicate the current value (process S1), the present disclosure is not limited thereto. A local control of the LED may be performed to turn on/off the LED and control the current value. For example, an electronic device (not shown) which is different from the CPU 104 and capable of communication with the LED jig 20 may transmit the instruction signal to turn on/off the LED and the control signal to control the current value to be supplied to the LED.

As described above, in the calibration method according to the present exemplary embodiment, the plasma processing apparatus 10 which is, for example, a mass-producing apparatus serves as the calibration target apparatus and the deviation between the detection values of the optical emission spectroscopy device 100 provided in the plasma processing apparatus 10 is specified and calibrated. Thus, it is possible to output the same detection value by any optical emission spectroscopy device 100.

For example, as shown in FIG. 9, there are deviations between the emission intensity (first data) of the plasma detected from the chamber of the reference apparatus 10c and the emission intensity (second data) of the plasma detected from, for example, chambers A and B of the calibration target apparatus 10e. These deviations between the detection values of the optical emission spectroscopy device 100 are calibrated by the calibration method according to the present exemplary embodiment. Thus, the detection values detected by the optical emission spectroscopy device 100 provided in the plurality of chambers A and B are matched to the first data as indicated by arrows in FIG. 9. Accordingly, it is possible to remove the deviations from the detection values detected by the optical emission spectroscopy device 100 provided in the chamber of the reference apparatus 10c.

Accordingly, it is possible to reduce the deviations in log data of the monitoring record of the optical emission spectroscopy between the plurality of chambers, and thus possible to increase the accuracy in data interpretation and improve the productivity.

[Led Jig]

In the above-described calibration method, the LED jig 20 is equipped with the LED light source 21, and the LED light source 21 is used as a standardized reference light source. The LED light source includes an OLED (organic light emitting diode). The light amount from a lamp light source decreases with the lapse of time. However, in the calibration method according to the exemplary embodiment, the LED or the OLED is used, and, thus, it is possible to avoid the decrease in the light amount with the lapse of time. Also, the LED light source 21 shows a smaller devices difference than the lamp light source, and is stable as a light source for a long period of time. Therefore, since the LED light source is used in the calibration method according to the exemplary embodiment, it is possible to further reduce the error in the optical emission spectroscopy conducted by the optical emission spectroscopy device 100.

Unlike the lamp light source, the LED light source 21 can readily adjust the light amount by controlling the current. Therefore, in the above-described calibration method, if the LED light source that outputs light having a continuous spectrum in a wavelength range of from 200 nm to 870 nm is used, the calibration can be performed in the wavelength range of from 200 nm to 870 nm.

FIG. 9 shows an example of the LED light output from the LED light source 21 according to the exemplary embodiment. Desirably, the LED light source 21 may output the light having the continuous spectrum in the wavelength range of from 200 nm to 870 nm. Also, the LED light source may be configured as a combination of a plurality of LED light sources having different wavelength ranges. The light output from the LED light source 21 is not limited to visible light, but may be ultraviolet light or infrared light. Also, the LED light source 21 may be configured to output light of various wavelengths (colors) by combination with, for example, a white LED.

[Modification Example of LED Jig]

Figure 10:
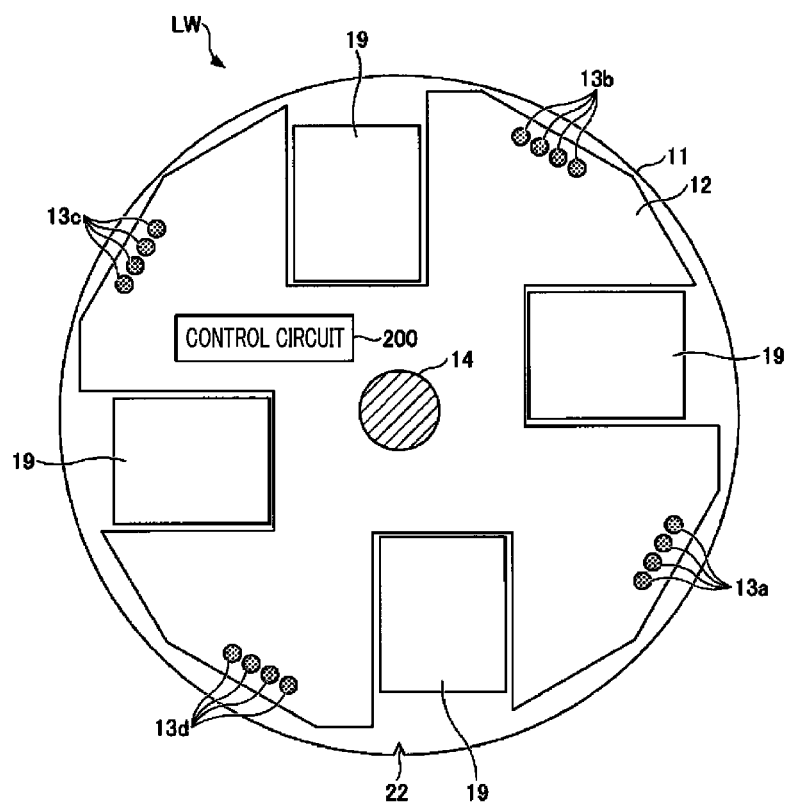
FIG. 10 shows an example of an LED jig according to a modification example of the exemplary embodiment.
Figure 11:
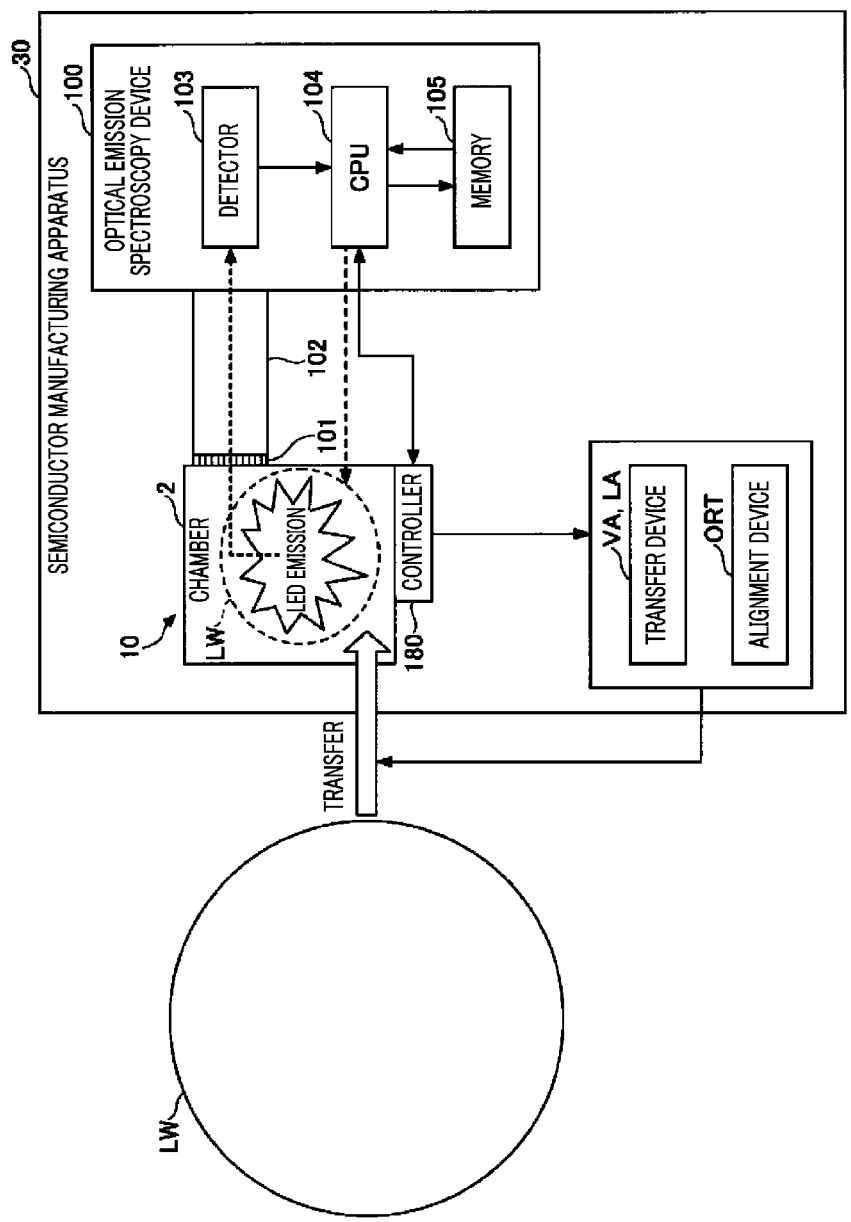
FIG. 11 is a diagram provided to explain an operation of a semiconductor manufacturing apparatus according to the modification example of the exemplary embodiment.

As a modification example of the LED jig, a wafer-type jig LW may be used instead of the LED jig 20. The wafer-type jig LW will be described with reference to FIG. 10 and FIG. 11. FIG. 10 shows an example of the wafer-type jig LW according to the modification example. FIG. 11 is a diagram provided to explain an operation of a semiconductor manufacturing apparatus 30 according to the modification example of the exemplary embodiment.

The jig LW includes a base 11, a control board 12, a plurality of LED light sources 13a to 13d (hereinafter, collectively referred to as "LED light source 13") and a battery 19. The base 11 is a substrate, for example, a disc-shaped wafer. The base 11 has a notch 22 in its edge. The base 11 may have any shape such as a polygonal shape, an oval shape and the like as long as it can be transferred by a transfer device configured to transfer a substrate. Thus, in the calibration system according to the exemplary embodiment, the jig LW can be transferred by a transfer device (a transfer arm or the like) provided in a transfer chamber while a vacuum level between the plasma processing apparatus 10 and the transfer chamber is maintained. The control board 12 is a circuit board provided on the base 11, and includes the LED light sources 13a to 13d, a connector 14 and a control circuit 200.

The LED light sources 13a to 13d are located at the control board 12 on the base 11. The LED light source 13a, the LED light source 13b, the LED light source 13c and the LED light source 13d emit light of different wavelengths (i.e., different colors), respectively. Each of the LED light sources 13a to 13d includes four LEDs configured to emit light of the same wavelength. Four LEDs configured to emit light of the same wavelength are arranged and the number of LEDs to be turned on can be changed, and, thus, the light amount of each wavelength can be increased and decreased. Here, the number of LED light sources 13 of each wavelength is not limited to four, and just needs to be more than one. The control circuit 200 controls the LED light source 13 to turn on and off, and also controls the current value in response to the instruction from the CPU 104. The control circuit 200 functions as a controller configured to control individual components of the jig LW. Also, the control circuit 200 functions as a communication unit configured to communicate with the CPU 104.

The connector 14 is a connector which is connected to an external power supply to charge the battery. For example, four batteries 19 are located on the base 11. The batteries 19 supply powers to the LED light sources 13a to 13d and the control circuit 200. The number of batteries is not limited to four and may be arbitrarily selected.

As shown in FIG. 11, the jig LW is transferred into the chamber 2 by a transfer device VA provided in a vacuum transfer chamber adjacent to the chamber 2 and a transfer device LA provided in an atmospheric transfer chamber that communicates with the vacuum transfer chamber via a load-lock chamber. An alignment device ORT is adjacent to the atmospheric transfer chamber. Since the wafer-type jig LW can be transferred by the transfer devices VA and LA, the jig LW can be transferred without exposing the chamber 2 to the atmosphere.

Also, the jig LW is transferred into the alignment device ORT and the position of the jig LW is specified with the notch 22 by rotating the jig LW. Further, a desired LED light source 13 is controlled to be close to the observation window 101 when the jig LW is placed on the stage ST. The above-described transfer control is performed by the controller 180 in response to the instruction from the CPU 104.

Even when the wafer-type jig LW is used, the CPU 104 may control each of the acquisition of the reference calibration data, the calculation of the calibration formula and the calibration of the detection value in the calibration method, or the controller 180 of the plasma processing apparatus 10 may control each of these operations in the calibration method.

For example, the controller 180 of the reference apparatus 10c may control a process of placing the wafer-type jig LW by transferring the jig LW into the chamber of the reference apparatus 10c, a process of acquiring the first data as the emission intensity of the LED light of each wavelength whose light amount is adjusted in stages by changing the light amount output from the LED light source of the wafer-type jig LW, and a process of storing the first data in the memory.

The controller 180 of the calibration target apparatus 10e may control a process of placing the wafer-type jig LW by transferring the jig LW into the chamber of the calibration target apparatus 10e, a process of acquiring the second data as the emission intensity of the LED light of each wavelength whose light amount is adjusted in stages by changing the light amount output from the LED light source of the wafer-type jig LW, and a process of calculating the calibration formula based on the first data stored in the memory and the second data.

In the calibration method using the wafer-type jig LW, the deviation between the detection values of the optical emission spectroscopy device 100 provided in the plasma processing apparatus 10 which is, for example, the mass-producing apparatus is calibrated. Thus, it is possible to output the detection value by any optical emission spectroscopy device 100 without the deviation from the detection value of the reference optical emission spectroscopy device 100.

Further, in a state where the LED light source 13 is disposed inside the chamber 2, the optical emission spectroscopy device 100 can receive the light. Also, in a state where the inside of the chamber 2 is maintained in the vacuum state without opening the lid and exposing the chamber 2 to the atmosphere, the jig LW can be transferred into the chamber 2. Thus, it is possible to improve the productivity.

[LED Light Source According to Modification Example]

In the above-described calibration method, the LED light source 21 configured to radiate light having a broad wavelength range of 200 nm to 870 nm (hereinafter, also referred to as "broad light") as the reference light is used. The LED light source 21 according to a modification example to be described below can simultaneously radiate two types of light including the broad light and light having a peak in a certain wavelength range. By performing the calibration method of the present disclosure by using the LED light source 21, it is possible to simultaneously perform "sensitivity calibration" of calibrating the broad light having the broad wavelength range and "calibration of a peak position" of calibrating a peak of light to a peak in an appropriate wavelength range by using light having a peak.

Figure 12A:
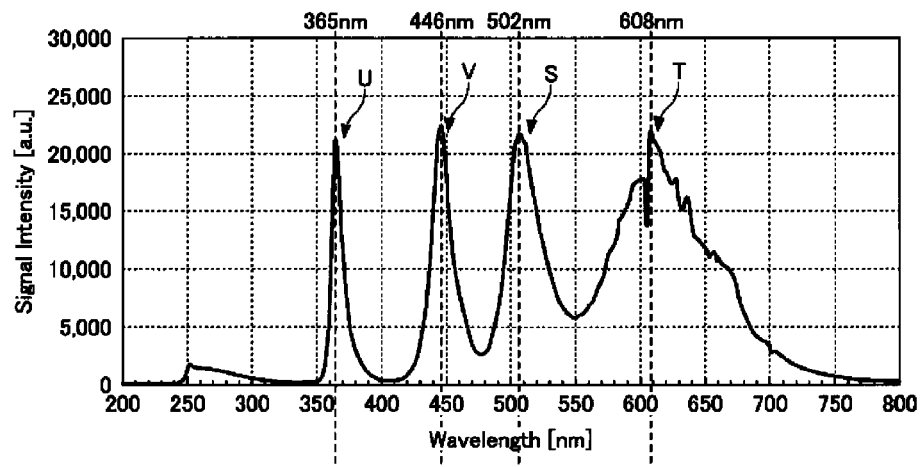
FIG. 12A and FIG. 12B are diagrams provided to explain an LED light source according to a modification example of the exemplary embodiment.
Figure 12B:
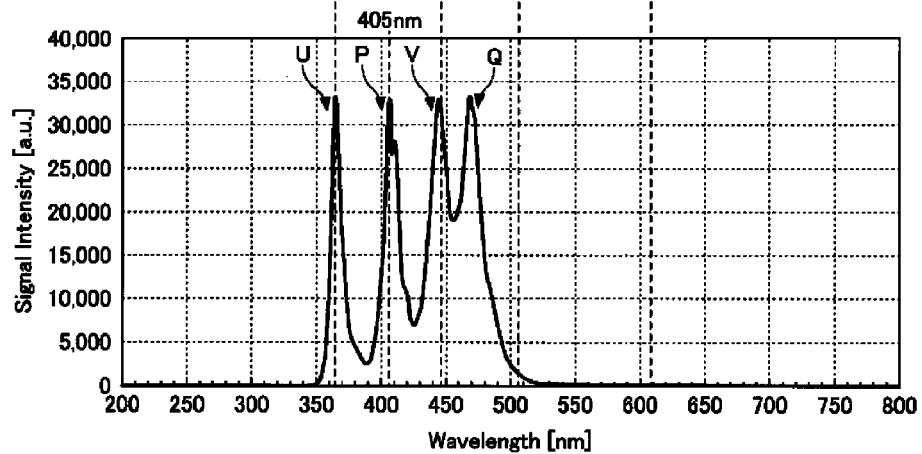

The LED light source 21 configured to radiate two types of light including the broad light and the light having the peak will be described with reference to FIG. 12A and FIG. 12B. If four LEDs configured to emit light having peaks U, V, S and T at wavelengths of 365 nm, 446 nm, 502 nm and 608 nm, respectively, is used, a continuous spectrum having a light signal intensity with four peaks as shown in FIG. 12A is obtained. As such, a plurality of types of LEDs having different peaks may be used to form a continuous spectrum. Here, for example, as can be seen from the wavelength range of from 365 nm to 446 nm in FIG. 12A, a light signal intensity may not be sufficient to be used in the calibration method of the present disclosure depending on the type of LEDs used.

The light has various peaks depending on the type of LED. Therefore, four LEDs that emit light having peaks U, P, V and Q at wavelengths of 365 nm, 405 nm, 446 nm and 470 nm, respectively, by reducing a peak interval (wavelength interval) of the light to about 40 nm are selected. In this case, the continuous spectrum having the light signal intensity with four peaks as shown in FIG. 12B is obtained. When the continuous spectrum is formed by using the plurality of LEDs having different the peaks as described above, a plurality of types of LEDs is selected in consideration of the peak interval. Thus, the selected plurality of types of LEDs may be used to form a continuous spectrum of broad light having a plurality of peaks at a predetermined wavelength and a light signal intensity of a predetermined level or more in a target wavelength range. The target wavelength range is desirable for light that spreads in a broadband, and may be desirably, for example, from 200 nm to 870 nm.

According to the above description, the single LED light source 21 can radiate the reference light in which the light having the plurality of clear peaks and the light that spreads in the target wavelength range are mixed by combining the plurality of types of LEDs having the different peaks. The calibration method of the present disclosure is performed by using the LED light source 21. Accordingly, it is possible to simultaneously perform "sensitivity calibration in the entire target wavelength range" of calibrating the broad light having the target wavelength range and "calibration of the peak position" of calibrating the peak of the light to the peak in the appropriate wavelength range by using the light having the peak. That is, according to the calibration method of the present disclosure, it is possible to simultaneously perform "sensitivity calibration in the entire target wavelength range" and "calibration of the peak position" by calibrating the light detected by the optical emission spectroscopy device 100 provided in the calibration target apparatus, The LED light source 21 that forms the continuous spectrum by combining the plurality of types of LEDs having different peak wavelengths has been described above. Also, by combining a plurality of types of LEDs with a fluorescent material that is excited by LED light and emits light, the light signal intensity of the continuous spectrum may be compensated by the fluorescent material. For example, the LED light source 21 may be prepared to form the continuous spectrum which includes the broad light in the desired target wavelength range and the light having the peak by compensating the light signal intensity with the combination of the plurality of types of LEDs and the fluorescent material.

[Configuration of LED Light Source]

Figure 13:
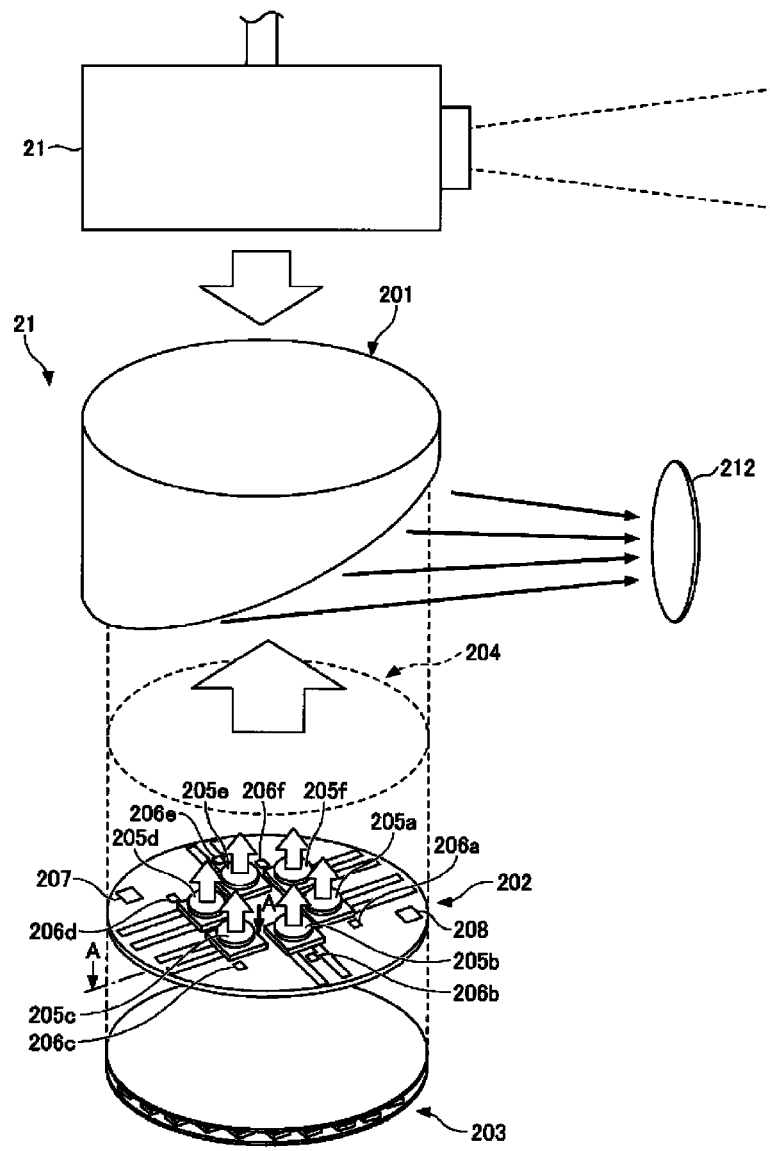
FIG. 13 is a perspective view of an LED light source according to a modification example of the exemplary embodiment.

Hereinafter, the configuration of the LED light source 21 according to the modification example that radiates the reference light in which the light having the plurality of clear peaks and the light that spreads in the broadband target wavelength range are mixed will be described with reference to FIG. 13. FIG. 13 is a schematic exploded perspective of the LED light source 21.

The LED light source 21 includes a condensing mechanism 201, a circuit board 202 and a cooling mechanism 203. A plurality of types of LEDs 205a to 205f, a DC power supply 207 and a controller 208 are provided on the circuit board 202. The LEDs 205a to 205f may also be collectively referred to as "LED 205". Although FIG. 13 illustrates that six types of LEDs 205a to 205f are provided, the number of LED 205 is not limited thereto. The number and type of LED 205 are determined to radiate the reference light in which the light having the plurality of clear peaks and the light that spreads in the broadband target wavelength range are mixed.

The LEDs 205a to 205f output light having different peak wavelengths. The DC power supply 207 supplies a direct current (DC) to each component provided on the circuit board 202. The controller 208 controls the LEDs 205a to 205f provided on the circuit board 202 to turn on/off.

The LEDs 205a to 205f are equipped with constant current circuits 206a to 206f, respectively. The constant current circuits 206a to 206f are provided in the LEDs 205a to 205f, respectively. The constant current circuits 206a to 206f are circuits configured to control an output current for the LEDs 205a to 205f to be constant. The luminance of the LED 205 is determined by a current value. For this reason, when the current value to be supplied to the LEDs 205a to 205f changes, the luminance of the LED 205 also changes. Therefore, each of the constant current circuits 206a to 206f controls the constant current to be supplied to each of the LEDs 205a to 205f. Thus, the signal intensity of light radiated from the LEDs 205a to 205f can be stabilized. Also, a peak position of light from the LEDs 205a to 205f can be changed by adjusting the current value with the constant current circuits 206a to 206f, and, thus, the color of the light from the plurality of LEDs can be adjusted.

Figure 14:
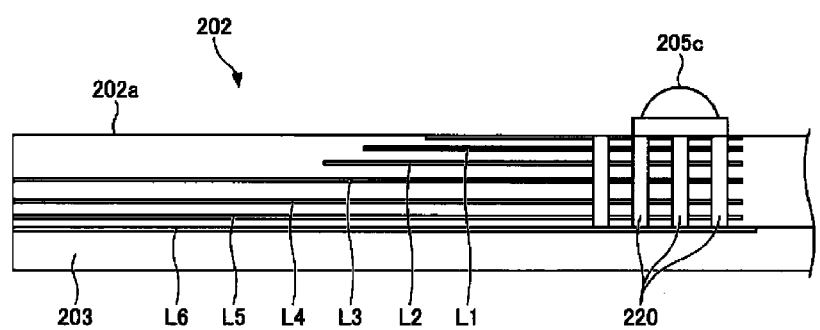
FIG. 14 is a cross-sectional view as taken along plane A-A of FIG. 13.

The circuit board 202 equipped with the LEDs 205a to 205f has a multilayer structure. FIG. 14 is a cross-sectional view of the circuit board 202 as taken along plane A-A. The circuit board 202 has six ground layers L1 to L6 sequentially stacked downwards from a top surface 202a on which the LED 205c is provided. A cathode electrode or an anode electrode of the LED 205c is connected to the ground layers L1 to L6 via metal wiring layers 220 located right under the LED 205c and penetrating the circuit board 202 in a longitudinal direction. Thus, heat generated from the LED 205c can be efficiently transferred to the ground layers L1 to L6. The ground layers L1 to L6 are made of metal, and configured to transfer the heat generated from the LED 205c to the cooling mechanism 203. Therefore, the heat can be efficiently dissipated from the cooling mechanism 203.

If the heat is accumulated in the LED 205c, the light amount from the LED 205c decreases. Therefore, to dissipate the heat generated from the LED 205c, the ground layers L1 to L6 function as a heat dissipation plate. Since the ground layers L1 to L6 are made of metal, it is easy to dissipate the heat. Therefore, the heat from the LED 205 can be efficiently dissipated from the ground layers L1 to L6 to the cooling mechanism 203. Thus, the LED light source 21 is configured not to change characteristics, such as the light amount, of the LED 205c.

Although FIG. 14 illustrates only the structure under the LED 205c, structures under the other LED 205 have the same configuration, and the multilayer structure of the ground layers L1 to L6 under each LED 205 functions to dissipate the heat. As the cooling mechanism 203, a heat sink, a plurality of Peltier elements or the like may be used.

Referring back to FIG. 13 again, in the condensing mechanism 201, light radiated from each of the LEDs 205a to 205f is condensed by a mirror or lens 212. Thus, the plurality types of LED 205 provided in the LED light source 21 radiates light, in which the light that spreads in the desired target wavelength range and the light having peaks at the plurality of different wavelengths are mixed, toward the optical emission spectroscopy device 100 via the condensing mechanism 201. Accordingly, the CPU 104 of the optical emission spectroscopy device 100 can calibrate the wavelength position of the light by using the peak position of the light and calibrate the sensitivity of light by using the broad light having the target wavelength range.

The LED light source 21 may further include a fluorescent material 204 between the condensing mechanism 201 and the circuit board 202. Thus, the light signal intensity of the continuous spectrum of the light radiated from the LED light source 21 may be compensated by the fluorescent material 204 that is excited by the light from the LED 205 and emits light.

According to the calibration method and the calibration system of the exemplary embodiments, it is possible to reduce the error in optical emission spectroscopy by suppressing the deviation between the detection results of the optical emission spectroscopy device 100 for each chamber caused by the influence of the installation components when the optical emission spectroscopy device 100 is connected to the chamber 2.

It should be understood that the calibration method and the calibration system according to the exemplary embodiments of the present disclosure are illustrative in all aspects and do not limit the present disclosure. The above-described exemplary embodiments can be variously changed and modified without departing from the scope and spirit of the present disclosure. The contents described in the above-described exemplary embodiments can be implemented in other embodiments without contradicting each other and can be combined without contradicting each other.

The plasma processing apparatus of the present disclosure has been described as the capacitively coupled plasma (CCP) processing apparatus, but is not limited thereto. The plasma processing apparatus of the present disclosure may be any one of an atomic layer deposition (ALD) apparatus, an apparatus using inductively coupled plasma (ICP), a radial line slot antenna (RLSA), electron cyclotron resonance plasma (ECR) and helicon wave plasma (HWP).

According to the present disclosure, it is possible to reduce an error in the optical emission spectroscopy device.

From the foregoing, it will be appreciated that various exemplary embodiments of the present disclosure have been described herein for purposes of illustration and various changes can be made without departing from the scope and spirit of the present disclosure. Accordingly, various exemplary embodiments described herein are not intended to be limiting, and the true scope and spirit are indicated by the following claims.

We claim:

1. A calibration method, comprising:
    placing an LED light source having a given wavelength range inside a reference apparatus;
    acquiring first data as an emission intensity of light at a wavelength, a light amount of the light being adjusted in stages by changing the light amount output from the LED light source;
    storing the first data in a memory;
    placing the LED light source in a calibration target apparatus;
    acquiring second data as an emission intensity of light at a wavelength, a light amount of the light being adjusted in the stages by changing the light amount output from the LED light source; and
    calculating a calibration formula based on the first data stored in the memory and the second data.

2. The calibration method of claim 1, further comprising:
    acquiring third data by calibrating the emission intensity, which is detected by an optical emission spectroscopy device provided in the calibration target apparatus, based on the calibration formula.

3. The calibration method of claim 2,
    wherein the emission intensity is an emission intensity of plasma inside the calibration target apparatus.

4. The calibration method of claim 1,
    wherein the given wavelength range is set in a range of from 200 nm to 870 nm.

5. The calibration method of claim 1,
wherein the LED light source is configured as a combination of multiple LEDs having different wavelength ranges.

6. The calibration method of claim 1,
wherein the light amount, which is output from the LED light source and is adjusted in the stages, is determined by a current value controlling the LED light source or a number of LEDs to be turned on/off in the LED light source.

7. The calibration method of claim 1,
wherein the LED light source placed inside the reference apparatus is identical to the LED light source placed in the calibration target apparatus.

8. The calibration method of claim 1,
wherein, by combining multiple types of LEDs having different wavelengths of peaks of light, the LED light source radiates light in which light having the peaks at the different wavelengths and light that spreads in a desired target wavelength range are mixed.

9. The calibration method of claim 8,
wherein calibration of a peak position of the wavelength and a sensitivity calibration of the light that spreads in the target wavelength range are simultaneously performed by calibrating the emission intensity detected by the optical emission spectroscopy device provided in the calibration target apparatus with the LED light source.

10. A calibration system, comprising:
a reference apparatus;
a calibration target apparatus;
a controller of the reference apparatus; and
a controller of the calibration target apparatus,
wherein the controller of the reference apparatus is configured to control:
placing an LED light source having a given wavelength range inside the reference apparatus;
acquiring first data as an emission intensity of light at a wavelength, a light amount of the light being adjusted in stages by changing the light amount output from the LED light source; and
storing the first data in a memory, and
wherein the controller of the calibration target apparatus is configured to control:
placing the LED light source in the calibration target apparatus;
acquiring second data as an emission intensity of light at a wavelength, a light amount of the light being adjusted in the stages by changing the light amount output from the LED light source; and
calculating a calibration formula based on the first data stored in the memory and the second data.

11. The calibration system of claim 10,
wherein the controller of the calibration target apparatus is configured to control acquiring third data by calibrating the emission intensity, which is detected by an optical emission spectroscopy device provided in the calibration target apparatus, based on the calibration formula.

12. The calibration system of claim 10,
wherein the controller of the reference apparatus is identical to the controller of the calibration target apparatus.

13. The calibration system of claim 10,
wherein the controller of the reference apparatus is different from the controller of the calibration target apparatus.

14. The calibration system of claim 10,
wherein the LED light source includes multiple types of LEDs having different wavelengths of peaks of light; and multiple constant current circuits respectively provided in the multiple types of LEDs.

15. The calibration system of claim 14,
wherein a peak position of light from the multiple types of LEDs is adjusted by adjusting a current with the constant current circuits.

16. The calibration system of claim 14, further comprising:
a circuit board equipped with the LED light source,
wherein the circuit board has a multilayer structure,
the multilayer structure includes ground layers, and
the multiple types of LEDs are configured to dissipate heat via the ground layers.

17. The calibration system of claim 16,
wherein cathode electrodes or anode electrodes of the multiple types of LEDs are connected to the ground layers.

* * * * *